(12) United States Patent
Song et al.

(10) Patent No.: US 8,877,579 B2
(45) Date of Patent: Nov. 4, 2014

(54) METHODS OF MANUFACTURING SEMICONDUCTOR DEVICES

(75) Inventors: Moon-kyun Song, Gyeonggi-do (KR); Ha-jin Lim, Seoul (KR); Moon-han Park, Gyeonggi-do (KR); Jin-ho Do, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 164 days.

(21) Appl. No.: 13/417,787

(22) Filed: Mar. 12, 2012

(65) Prior Publication Data

US 2012/0309145 A1 Dec. 6, 2012

(30) Foreign Application Priority Data

May 31, 2011 (KR) .......................... 10-2011-0052395

(51) Int. Cl.
*H01L 21/336* (2006.01)
*H01L 21/8238* (2006.01)
*H01L 21/8234* (2006.01)

(52) U.S. Cl.
CPC ...... *H01L 21/823412* (2013.01); *H01L 21/823807* (2013.01)
USPC .................... 438/217; 438/289; 257/E21.633

(58) Field of Classification Search
CPC .............. H01L 21/823807; H01L 21/823412
USPC ............ 438/217, 289; 257/E21.618, E21.633
See application file for complete search history.

(56) References Cited

U.S. PATENT DOCUMENTS

| | | | | |
|---|---|---|---|---|
| 5,250,818 A * | 10/1993 | Saraswat et al. | ................ | 257/66 |
| 5,460,693 A * | 10/1995 | Moslehi | ........................ | 438/766 |
| 5,480,828 A * | 1/1996 | Hsu et al. | ...................... | 438/275 |
| 5,620,906 A * | 4/1997 | Yamaguchi et al. | .......... | 438/162 |
| 5,712,177 A * | 1/1998 | Kaushik et al. | ............... | 438/591 |
| 5,994,210 A * | 11/1999 | Kerr | ............................... | 438/592 |
| 6,037,640 A * | 3/2000 | Lee | ............................... | 257/408 |
| 6,130,144 A * | 10/2000 | Verret | .......................... | 438/542 |
| 6,191,463 B1 * | 2/2001 | Mitani et al. | .................. | 257/411 |
| 6,249,026 B1 * | 6/2001 | Matsumoto et al. | .......... | 257/349 |
| 6,261,889 B1 * | 7/2001 | Ono | .............................. | 438/232 |
| 6,436,783 B1 * | 8/2002 | Ono et al. | ...................... | 438/366 |
| 6,495,424 B2 * | 12/2002 | Kunikiyo | ...................... | 438/296 |
| 6,693,012 B2 * | 2/2004 | Mouli et al. | ................... | 438/302 |
| 6,700,170 B1 * | 3/2004 | Morosawa et al. | ........... | 257/410 |
| 6,720,213 B1 * | 4/2004 | Gambino et al. | ............. | 438/184 |
| 6,756,291 B1 * | 6/2004 | Hao et al. | ...................... | 438/586 |
| 6,797,555 B1 * | 9/2004 | Hopper et al. | ................. | 438/217 |
| 6,838,329 B2 * | 1/2005 | Weber et al. | ................... | 438/217 |

(Continued)

FOREIGN PATENT DOCUMENTS

JP 2008-218852 A 9/2008
KR 20080048766 A 6/2008

*Primary Examiner* — Mary Wilczewski
(74) *Attorney, Agent, or Firm* — Harness, Dickey & Pierce, P.L.C.

(57) ABSTRACT

Methods of manufacturing semiconductor devices include providing a substrate including a NMOS region and a PMOS region, implanting fluorine ions into an upper surface of the substrate, forming a first gate electrode of the NMOS region and a second gate electrode of the PMOS region on the substrate, forming a source region and a drain region in portions of the substrate, which are adjacent to two lateral surfaces of the first gate electrode and the second gate electrode, respectively, and performing a high-pressure heat-treatment process on an upper surface of the substrate by using non-oxidizing gas.

4 Claims, 10 Drawing Sheets

(56) References Cited

U.S. PATENT DOCUMENTS

| | | | |
|---|---|---|---|
| 6,853,037 B2 * | 2/2005 | Kudo et al. | 257/369 |
| 7,129,533 B2 * | 10/2006 | Weber et al. | 257/285 |
| 7,163,878 B2 * | 1/2007 | Kohli et al. | 438/520 |
| 7,199,063 B2 * | 4/2007 | Lin | 438/765 |
| 7,459,752 B2 * | 12/2008 | Doris et al. | 257/348 |
| 7,482,211 B2 * | 1/2009 | Nieh et al. | 438/162 |
| 7,608,515 B2 * | 10/2009 | Chen et al. | 438/297 |
| 7,642,150 B2 * | 1/2010 | Arevalo et al. | 438/215 |
| 7,645,665 B2 * | 1/2010 | Kubo et al. | 438/232 |
| 7,705,400 B2 * | 4/2010 | Shimizu et al. | 257/347 |
| 7,838,887 B2 * | 11/2010 | Woon et al. | 257/74 |
| 7,867,839 B2 * | 1/2011 | Chen et al. | 438/217 |
| 7,893,502 B2 * | 2/2011 | Li et al. | 257/369 |
| 8,053,306 B2 * | 11/2011 | Carter et al. | 438/228 |
| 8,232,605 B2 * | 7/2012 | Lin et al. | 257/369 |
| 2001/0041432 A1 * | 11/2001 | Lee | 438/530 |
| 2004/0195631 A1 * | 10/2004 | Chakravarthi et al. | 257/368 |
| 2006/0081836 A1 * | 4/2006 | Kimura et al. | 257/19 |
| 2006/0263992 A1 * | 11/2006 | Chen et al. | 438/301 |
| 2007/0210421 A1 * | 9/2007 | Bu et al. | 257/635 |
| 2007/0218663 A1 * | 9/2007 | Hao et al. | 438/532 |
| 2008/0023732 A1 * | 1/2008 | Felch et al. | 257/288 |
| 2008/0108208 A1 * | 5/2008 | Arevalo et al. | 438/514 |
| 2008/0145985 A1 * | 6/2008 | Chi | 438/199 |
| 2008/0293194 A1 * | 11/2008 | Chen et al. | 438/199 |
| 2010/0112795 A1 * | 5/2010 | Kaim et al. | 438/515 |
| 2010/0289088 A1 | 11/2010 | Li et al. | |
| 2012/0214286 A1 * | 8/2012 | Lin et al. | 438/290 |
| 2012/0309145 A1 * | 12/2012 | Song et al. | 438/217 |
| 2013/0256686 A1 * | 10/2013 | Kanamura | 257/76 |
| 2013/0267083 A1 * | 10/2013 | Suguro | 438/527 |

* cited by examiner

METHODS OF MANUFACTURING SEMICONDUCTOR DEVICES

CROSS-REFERENCE TO RELATED APPLICATION

This application claims the benefit of Korean Patent Application No. 10-2011-0052395, filed on May 31, 2011, in the Korean Intellectual Property Office, the disclosure of which is incorporated herein in its entirety by reference.

BACKGROUND

1. Field

Example embodiments of the inventive concepts relate to methods of manufacturing semiconductor devices.

2. Description of the Related Art

Along with industrial and multimedia development, semiconductor devices used in computers, mobile equipment, or the like are highly integrated and have high performance. In line with increases in integration density of semiconductor devices, the numerical value of design rules required for components of the semiconductor devices has been reduced. In particular, with regard to a semiconductor device requiring many transistors, the length of a gate, which is a design rule reference, is reduced. Accordingly, the length of a channel is reduced.

SUMMARY

Example embodiments of the inventive concepts may provide methods of manufacturing semiconductor devices to obtain high integration density, and improved performance and reliability.

According to an example embodiment of the inventive concepts, a method of manufacturing a semiconductor device includes providing a substrate including an NMOS region and a PMOS region, implanting fluorine ions into an upper surface of the substrate, forming a first gate electrode of the NMOS region and a second gate electrode of the PMOS region on the substrate, forming a source region and a drain region in portions of the substrate, which are adjacent to two lateral surfaces of the first gate electrode and the second gate electrode, respectively, and performing a high-pressure heat-treatment process on an upper surface of the substrate by using non-oxidizing gas.

The implanting of the fluorine ions may include implanting the fluorine ions into a channel region formed in the substrate between the source region and the drain region. The implanting of the fluorine ions may be performed after the first gate electrode and the second gate electrode are formed. The fluorine ions may be implanted with a concentration of about $1 \times 10^{15}/cm^3$ to about $1 \times 10^{16}/cm^3$. The method may include growing a silicon germanium (SiGe) layer on the substrate of the PMOS region. The implanting of the fluorine ions may be performed after the SiGe layer is grown. The high-pressure heat-treatment process may reduce defects of a channel region formed in the substrate between the source region and the drain region. The high-pressure heat-treatment process may be performed under an atmosphere of hydrogen or heavy hydrogen. The high-pressure heat-treatment process may be performed at a temperature of about 350 to about 600 and a pressure of about 10 atm to about 30 atm.

The method may include, prior to the performing of the high-pressure heat-treatment process, forming contact plugs that are electrically connected to the source region and the drain region, respectively; and forming a wiring line connected to the contact plugs. The performing of the high-pressure heat-treatment process may be performed both after the first gate electrode and the second gate electrode are formed, and after the wiring line is formed. The method may further include, prior to forming of the first gate electrode and the second gate electrode, forming a gate insulating layer. The gate insulating layer includes a dielectric material with a high-dielectric constant (k), and the first gate electrode and the second gate electrode includes metal.

According to at least one other example embodiment of the inventive concepts, a method of manufacturing a semiconductor device includes providing a substrate, implanting fluorine ions into an upper surface of the substrate, forming a gate structure including a gate insulating layer and a gate electrode on the substrate, and performing a high-pressure heat-treatment process on an entire surface of the substrate by using non-oxidizing gas. The implanting of the fluorine ions may include implanting the fluorine ions into a channel region formed in the substrate below the gate structure. The channel region may include germanium (Ge).

According to at least one example embodiment, a method of manufacturing a semiconductor device includes providing a substrate including an NMOS region and a PMOS region, implanting fluorine ions into an upper surface of the substrate, forming a first gate electrode on the substrate in the NMOS region and a second gate electrode on the substrate in the PMOS region, forming source and drain regions adjacent to the first and second gate electrodes, and performing a high-pressure heat-treatment process to an upper surface of the substrate using a non-oxidizing gas. According to at least one example embodiment, a method of manufacturing a semiconductor device includes implanting fluorine ions into an upper surface of a substrate, forming a gate structure including a gate insulating layer and a gate electrode on the substrate, and performing a high-pressure heat-treatment process on an entire surface of the substrate using a non-oxidizing gas.

According to at least one example embodiment, a method of manufacturing a semiconductor device includes heat treating a substrate including a plurality of fluorinated transistor channel regions under high pressure in a non-oxidizing atmosphere.

BRIEF DESCRIPTION OF THE DRAWINGS

Example embodiments will be more clearly understood from the following brief description taken in conjunction with the accompanying drawings. FIGS. 1-16B represent non-limiting, example embodiments as described herein.

FIG. 1 is a cross-sectional diagram illustrating semiconductor devices according to at least one example embodiment;

FIGS. 2-9 are cross-sectional diagrams illustrating methods of manufacturing a semiconductor device of FIG. 1 according to at least one example embodiment;

FIG. 10 is a cross-sectional diagram illustrating semiconductor devices according to at least one example embodiment;

FIGS. 11-13 are cross-sectional diagrams illustrating methods of manufacturing semiconductor devices according to at least one other example embodiment;

FIG. 15 is a graph illustrating semiconductor device characteristics according to at least one example embodiment; and FIGS. 16A and 16B are graphs illustrating semiconductor device characteristics according to at least one example embodiment.

Figure 1:
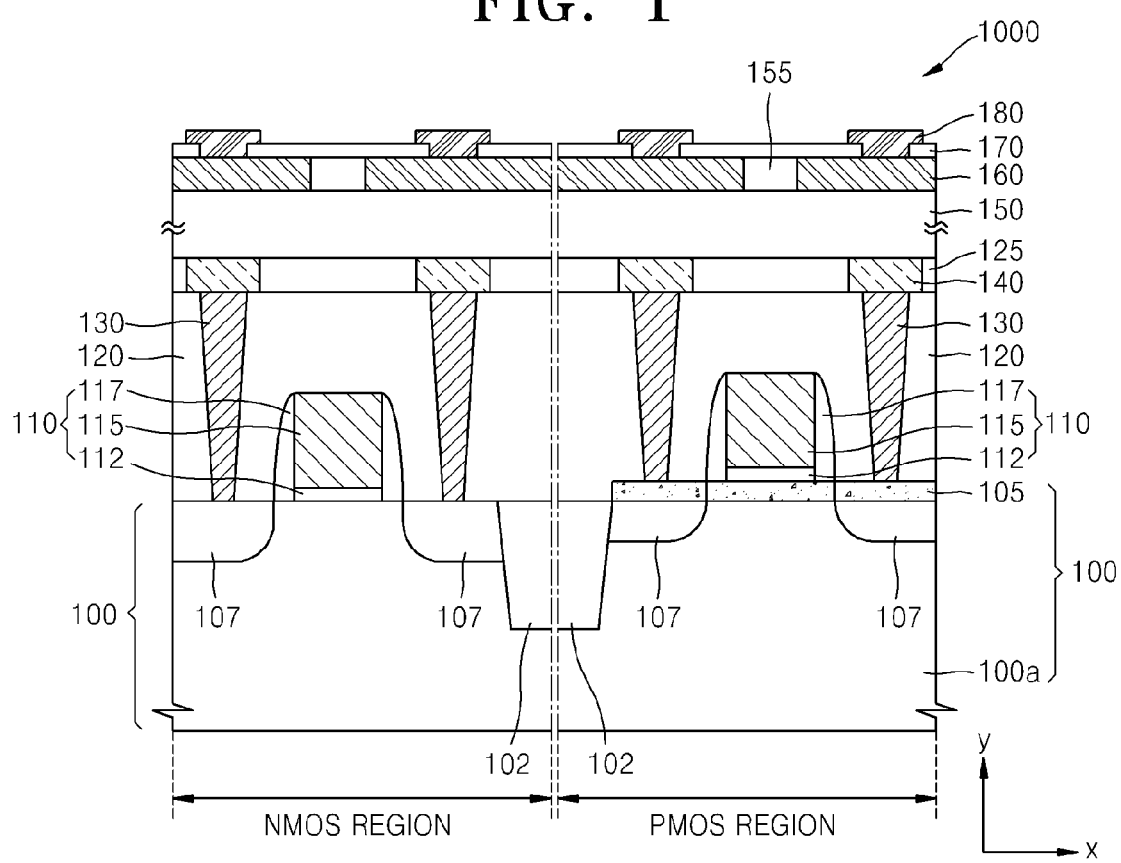

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram illustrating semiconductor devices according to at least one example embodiment. Referring to FIG. 1, a semiconductor device 1000 may include an NMOS region including an n-channel metal-oxide-semiconductor field effect transistor (MOSFET) and a PMOS region including a p-channel MOSFET. A substrate 100 may include a device isolation layer 102 and an active region defined by the device isolation layer 102. The semiconductor device 1000 may include a gate structure 110, and contact plugs 130 on source and drain regions 107 (hereinafter, referred to as the source/drain regions 107) that may be at two sides of the gate structure 110. The gate structure 110 and the source/drain regions 107 may be disposed in each of the NMOS and PMOS regions of the substrate 100. The semiconductor device 1000 may be a logic device and/or a memory device, for example.

The substrate 100 may be, for example, a silicon single crystalline substrate or an epitaxial layer. The substrate 100 may include a well region (not shown) including impurities (e.g., implanted impurities). In the PMOS region, the substrate 100 may include a semiconductor layer 105 formed thereon. A portion that may be obtained by excluding the semiconductor layer 105 may be illustrated as a base substrate 100a. The semiconductor layer 105 may include a semiconductor material, for example, a Group IV semiconductor, a Group III-V compound semiconductor, and/or a Group II-VI oxide semiconductor. For example, the semiconductor layer 105 may include an epitaxial layer of silicon germanium (SiGe). Because a band gap of SiGe may be less than a band gap of silicon, a threshold voltage of the semiconductor device 1000 may be controlled. Because charge mobility of SiGe may be relatively high, current characteristics of the semiconductor device 1000 may be improved.

The device isolation layer 102 may include a shallow trench isolation (STI) structure that may be configured as a trench formed in the substrate 100. The device isolation layer 102 may include at least one oxide, for example, at least one of TOnen SilaZene (TOSZ), a high temperature oxide (HTO), a high density plasma (HDP) material, tetra ethyl ortho silicate (TEOS), boron-phosphorus silicate glass (BPSG), and undoped silicate glass (USG). The substrate 100 may include the source/drain regions 107 at two sides of the gate structure 110. The source/drain regions 107 may be a depth into an active region of the substrate 100, and may be an impurity region including impurities. In the NMOS region, impurities may be n-type impurities, for example, phosphorus (P), arsenic (As), and/or antimony (Sb). In the PMOS region, the impurities may be p-type impurities, for example, boron (B), aluminum (Al), and/or gallium (Ga).

The gate structure 110 may include a gate insulating layer 112, a gate electrode 115, and a spacer 117. The gate insulating layer 112 may include, for example, a material with a high dielectric constant (high-k). The gate electrode 115 may include, for example, metal and/or polysilicon. The spacer 117 may be on a lateral surface of the gate insulating layer 112 and a lateral surface of the gate electrode 115. The spacer 117 may include, for example, silicon nitride and/or silicon oxide, and may include multiple layers including, for example, the silicon nitride and/or silicon oxide. The contact plugs 130 may be on the source/drain regions 107. The contact plugs 130 may be disposed so as to apply voltages to the source/drain regions 107 in order to operate the semiconductor device 1000. The contact plugs 130 may be connected to the source/drain regions 107 through an interlayer insulating layer 120. Upper portions of the contact plugs 130 may be connected to a wiring line 140. In a region that is not shown in FIG. 1, the gate structure 110 may be connected to the wiring line through a separate plug shaped conductor.

The wiring line 140 may be connected to the contact plugs 130, and may extend perpendicular to an x-axis direction and a y-axis direction. The wiring line 140 may be in a wiring insulating layer 125. An upper insulating layer 150 and an upper wiring line 160 may be on the wiring line 140. The upper wiring line 160 may be in an upper wiring insulating layer 155. Although not illustrated, a plurality of wiring lines and vias may be formed in the upper insulating layer 150. The upper wiring line 160 may be an uppermost wiring layer of the semiconductor device 1000. An insulating layer 170 may be on the upper wiring line 160 so as to passivate structures below the insulating layer 170. In a region without the insulating layer 170, conductive pads 180 may be electrically connected to the upper wiring line 160. The conductive pads 180 may electrically connect the semiconductor device 1000 to an external device (not shown).

Figure 2:
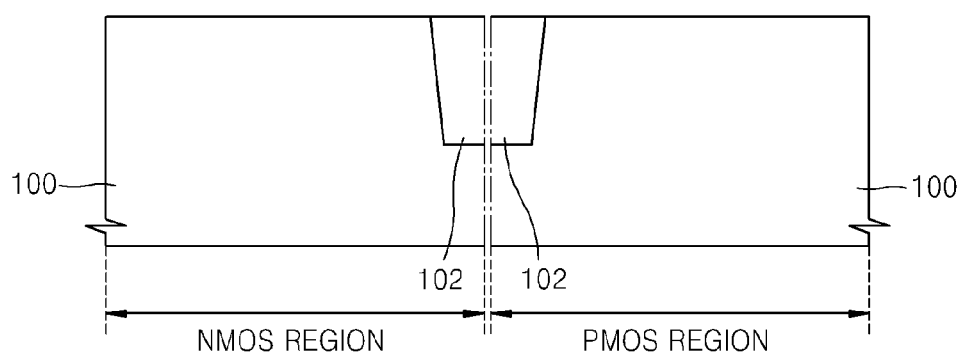

FIGS. 2-9 are cross-sectional diagrams illustrating methods of manufacturing semiconductor devices according to at least one example embodiment. Referring to FIG. 2, a device isolation layer 102 may be formed in a substrate 100. A well that is not illustrated may be formed in the substrate 100. For example, a P well may be formed by implanting p-type impurities into the NMOS region, and an N well may be formed by implanting n-type impurities into the PMOS region. According to at least one example embodiment, an impurity implantation process for improving threshold voltage characteristics of the semiconductor device 1000 may be performed on the active region that may be defined by the device isolation layer 102. The device isolation layer 102 may be formed by forming a device isolation trench using, for example, an etch process. An insulating material may be deposited in the device isolation trench. The device isolation layer 102 may be formed by depositing the insulating material and performing a planarization process, for example, a chemical mechanical polishing (CMP) process.

Figure 3:
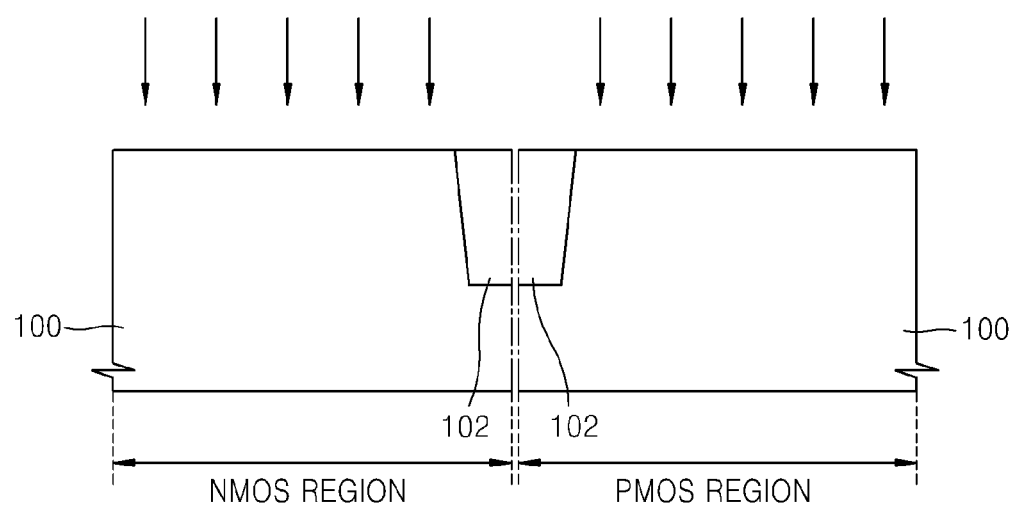

Referring to FIG. 3, fluorine ions may be implanted into an entire surface of the substrate 100. Arrows of FIG. 3 may denote the fluorine ions. The fluorine ions may be implanted at an energy of, for example, about 15 KeV. A concentration of the fluorine ions may be about $1 \times 10^{15}/cm^3$ to about $1 \times 10^{16}/cm^3$. A depth to which the fluorine ions may be implanted into the substrate 100 may be adjusted so that the fluorine ions may be implanted into a channel region of the semiconductor device 1000 that may be manufactured by using a method according to example embodiments. The fluorine ions may activate impurities in the substrate 100 on the channel region of the semiconductor device 1000. According to at least one other example embodiment, the fluorine ions may be implanted into the PMOS region only.

Figure 4:
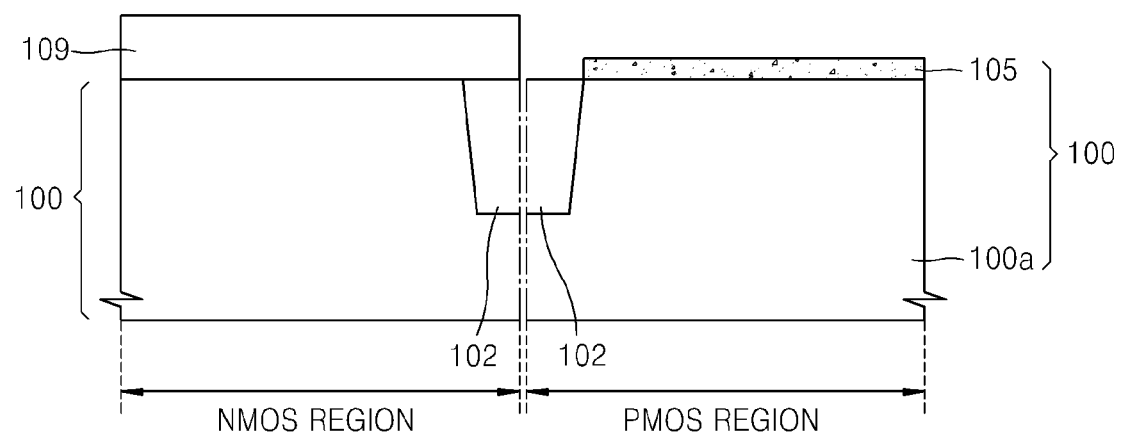

Referring to FIG. 4, in order to selectively form a semiconductor layer 105 in the PMOS region only, a mask layer 109 may be formed on the NMOS region. The mask layer 109 may include, for example, silicon oxide. The semiconductor layer 105 may be, for example, a silicon germanium (SiGe) layer, and may be formed by growing an epitaxial layer in the PMOS region. The semiconductor layer 105 may be an upper portion of the substrate 100. A portion that may be obtained by excluding the semiconductor layer 105 may be referred to as a base substrate 100a. The semiconductor layer 105 may be formed by performing, for example, a selective epitaxial growth (SEG) method on the base substrate 100a. The semiconductor layer 105 may not be formed on the device isolation layer 102. The semiconductor layer 105 may be formed to a thickness of about 200 Å to about 400 Å. According to at least one example embodiment, the fluorine ion implantation process described with reference to FIG. 3 may be performed after the semiconductor layer 105 is formed.

Figure 5:
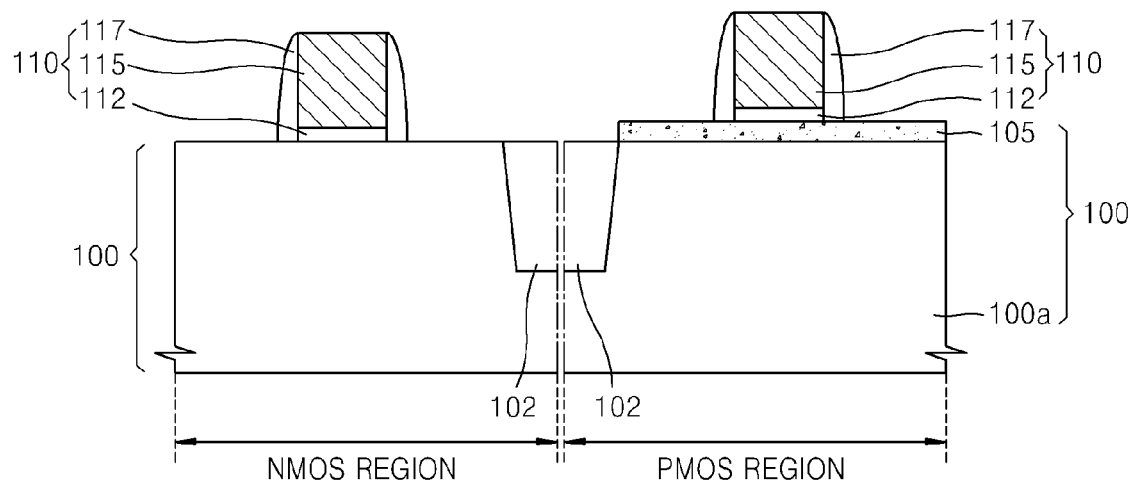

Referring to FIG. 5, a gate structure 110 may be formed on the substrate 100. The gate structure 110 may be formed by sequentially depositing a material for forming the gate insulating layer 112 and a material for forming the gate electrode 115 and patterning the materials. The gate insulating layer 112 may include, for example, a silicon oxide (e.g., $SiO_2$), a dielectric material with a high-dielectric constant (high-k), and/or a composite layer including a silicon oxide (e.g., $SiO_2$) and a silicon nitride (e.g., SiN). A high-k material may refer to a dielectric material with a higher dielectric constant than silicon dioxide ($SiO_2$). The high-k dielectric material may include, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$).

The gate electrode 115 may include doped poly silicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), and/or nitrides thereof. The gate electrode 115 may include a single or composite layer including at least one of the foregoing. For example, the gate electrode 115 may include a composite layer including a metal material and doped poly silicon. A spacer 117 may be formed on a lateral surface of the gate insulating layer 112 and a lateral surface of the gate electrode 115. The spacer 117 may include an insulating material, for example, a silicon nitride. The spacer 117 may be formed by, for example, depositing an insulating material and performing an etch-back process so an upper portion of the gate structure 110 and an upper portion of the substrate 100 are exposed at two sides of the gate structure 110.

Figure 6:
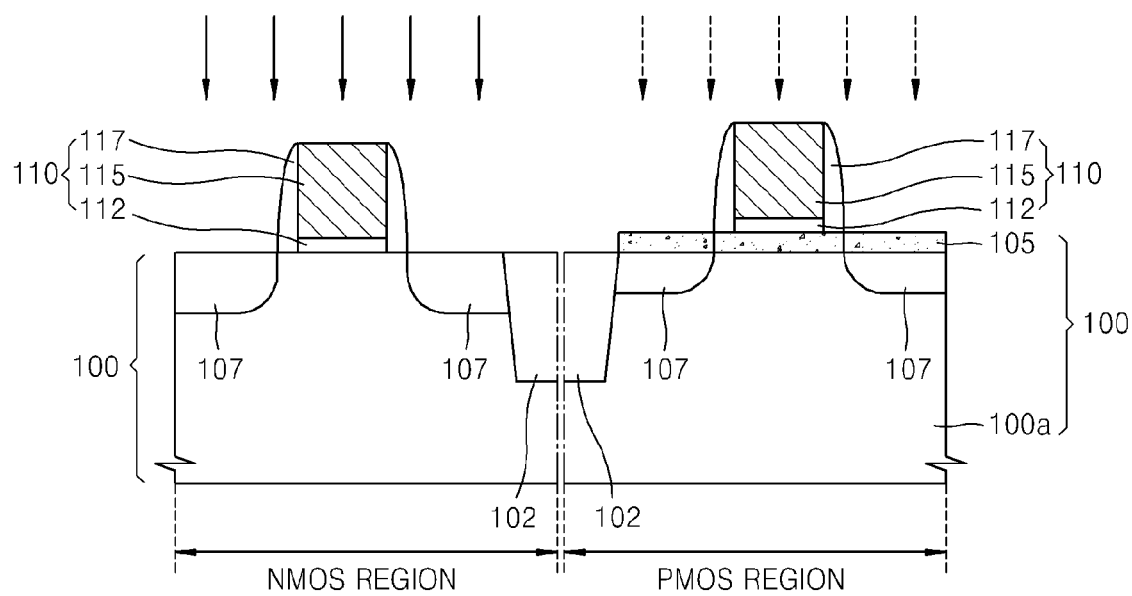

Referring to FIG. 6, in order to form the source/drain regions 107, impurities may be implanted by using the gate structure 110 as a mask, for example. Arrows of FIG. 6 may denote impurities. Impurities may be implanted by implanting ions at, for example, an angle. The implanted impurities may be of different conductive types in the NMOS region and the PMOS region. Although not illustrated, impurities may be, for example, sequentially implanted into the NMOS region and the PMOS region. According to at least one example embodiment, a separate mask layer may be formed on a region into which impurities are not implanted. In the NMOS region, the impurities may be n-type impurities, for example, phosphorus (P), arsenic (As), and/or antimony (Sb). In addition, in the PMOS region, the impurities may be p-type impurities, for example, boron (B), aluminum (Al), and/or gallium (Ga). According to at least one example embodiment, the above-described fluorine ion implantation process may be performed after the gate structure 110 is formed. In order to implant fluorine ions into a channel region of a semiconductor device 1000 after the gate structure is formed, the fluorine ion implantation process may be performed at a tilted angle.

Figure 7:
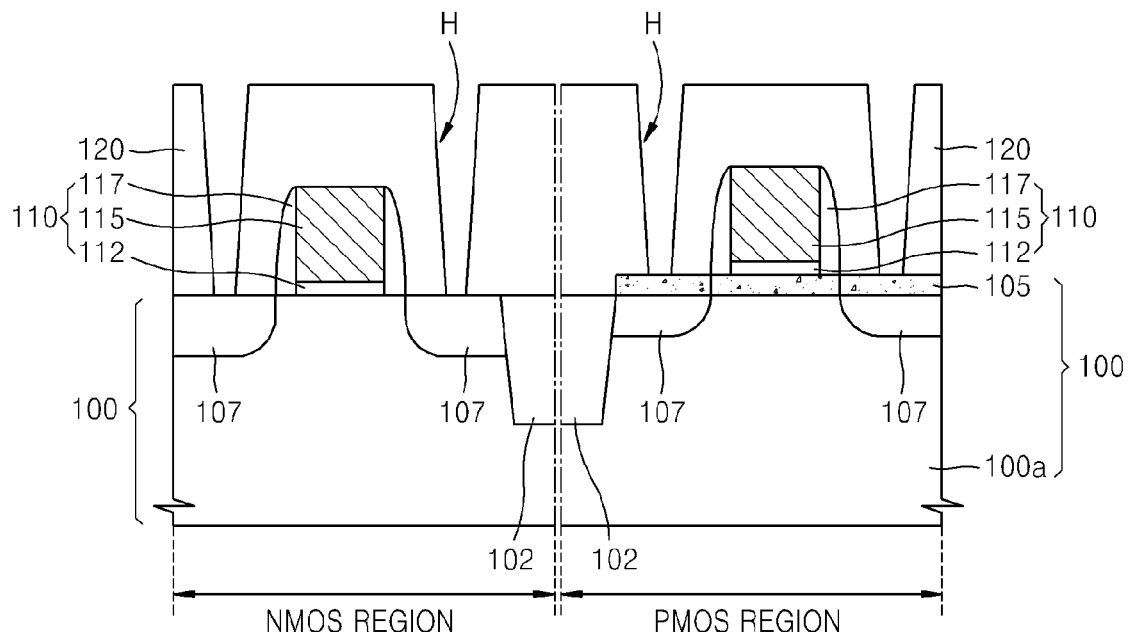
Figure 8:
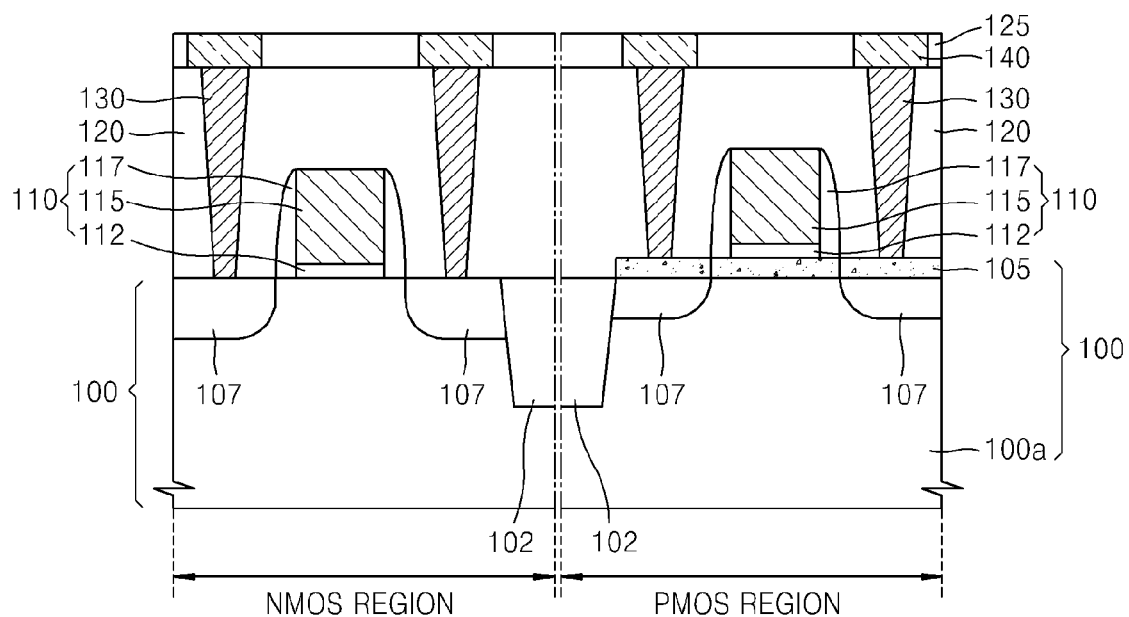

Referring to FIG. 7, the interlayer insulating layer 120 may be formed on an entire surface of the substrate 100. The interlayer insulating layer 120 may include a silicon oxide. The interlayer insulating layer 120 may include, for example, one of a TOnen SilaZene (TOSZ) layer, a high temperature oxide (HTO) layer, a high density plasma (HDP) layer, a tetra ethyl ortho silicate (TEOS) layer, a boron-phosphorus silicate glass (BPSG) layer, and an undoped silicate glass (USG) layer. A mask layer (not shown) may be formed on the interlayer insulating layer 120. Contact holes H may be formed by, for example, partially etching the interlayer insulating layer 120 on the source/drain regions 107. The etch may be, for example, an anisotropic etch Referring to FIG. 8, the contact plugs 130 may be formed by forming a conductive material in the contact holes H of FIG. 7. The conductive material may include, for example, tungsten (W). A planarization process, for example, a chemical mechanical polishing (CMP) process and/or an etch-back process may be performed. The wiring insulating layer 125 and the wiring line 140 including a conductive material may be formed on the interlayer insulating layer 120 and the contact plugs 130. The wiring line 140 may include, for example, copper (Cu). The wiring line 140 may be formed by, for example, using a damascene process that may include an engraved wiring pattern in the wiring insulating layer 125 and filling Cu into the engraved wiring pattern.

Figure 9:
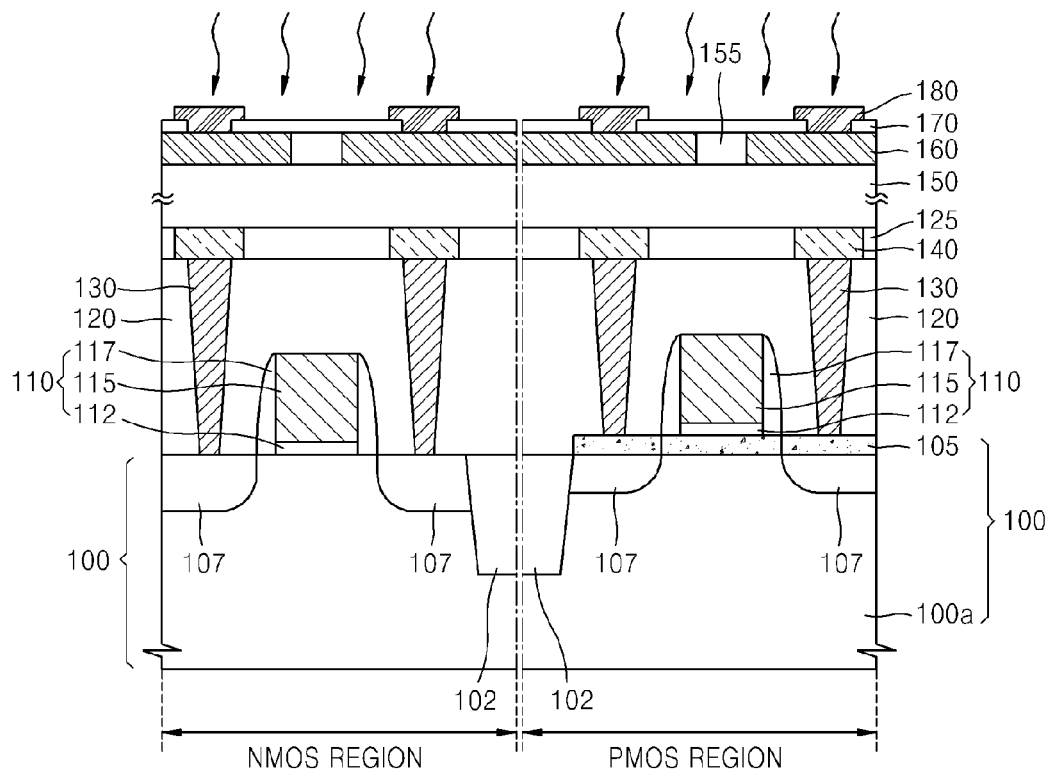

Referring to FIG. 9, the upper insulating layer 150 may be formed on the wiring line 140 and the wiring insulating layer 125. In an uppermost portion, the upper wiring line 160 may be formed in the upper wiring insulating layer 155, and may be connected to a lower wiring line through a via that is not illustrated. The upper wiring line 160 may include, for example, aluminum (Al). A plurality of wiring lines and vias, which may not be illustrated, may be formed in the upper insulating layer 150. The number of the wiring lines may be changed in various ways. The upper wiring line 160 may be electrically connected to lower wiring layers, and may apply a predetermined voltage to the source/drain regions 107 through the wiring line 140. Although not illustrated, the upper wiring line 160 may be electrically connected to the gate electrode 115 so as to apply a voltage to the gate electrode 115.

The insulating layer 170 may be formed on the upper wiring line 160, and the conductive pads 180 may be formed on the insulating layer 170. The conductive pads 180 may electrically connect the upper wiring line 160 to an external device (not shown). A high-pressure heat-treatment process may be performed. Arrows of FIG. 9 may indicate the high-pressure heat-treatment process. The high-pressure heat-treatment process may be performed, for example, under a non-oxidizing atmosphere that may use hydrogen and/or heavy hydrogen. Hydrogen and/or heavy hydrogen may be used together with nitrogen. The high-pressure heat-treatment process may be performed at a temperature of about 350° C. to about 600° C. and a pressure of about 10 atm to about 30 atm. Interface defects between the channel region of the semiconductor device 1000 and the gate insulating layer 112 may be passivated so as to be reduced by hydrogen and/or heavy hydrogen of the high-pressure heat-treatment process.

According to at least one example embodiment, the high-pressure heat-treatment process may be performed after another process, for example, a process for forming the wiring line 140 and/or a process for forming the gate structure 110. The high-pressure heat-treatment process may be performed after the wiring line 140 is formed, and/or the gate structure 110 is formed, which may be performed a plurality of times. According to at least one example embodiment, the high-pressure heat-treatment process may be performed after the conductive pads 180 are formed, thereby possibly preventing effects of the high-pressure heat-treatment process from degrading due to processes for forming wiring layers including the wiring line 140.

Figure 10:
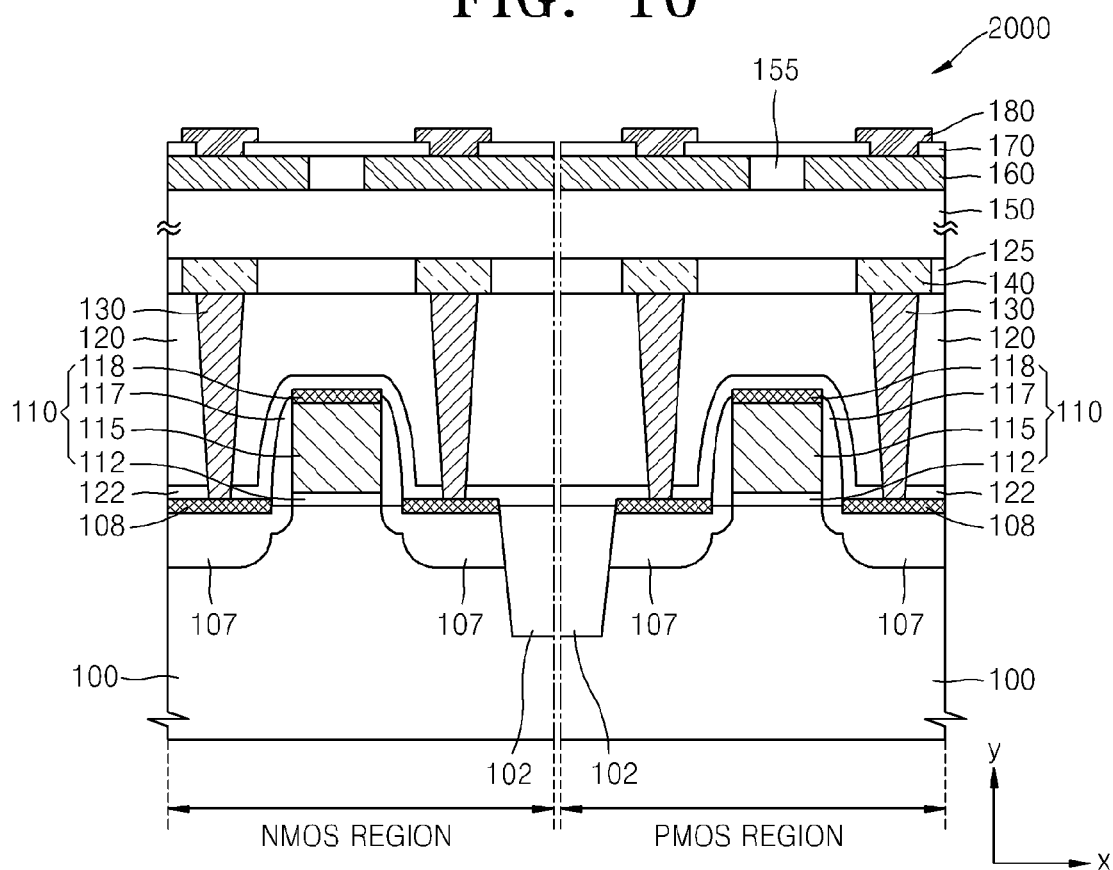

FIG. 10 is a cross-sectional diagram of a semiconductor device 2000 according to at least one example embodiment. Hereinafter, the same reference numerals as in FIG. 1 may denote the same elements as in FIG. 1, and thus their detailed description may be omitted herein. Referring to FIG. 10, the semiconductor device 2000 may include a gate structure 110 and contact plugs 130 that may be formed on the source/drain regions 107. The source/drain regions 107 may be formed at two sides of the gate structure 110. The gate structure 110 and the source/drain regions 107 may be in each of the NMOS and PMOS regions of the substrate 100. The semiconductor device 2000 may be, for example, a logic device and/or a memory device.

A metal silicide region 108 may be formed on the source/drain regions 107. A metal silicide layer 118 may be formed on the gate electrode 115. The source/drain regions 107 may each include a low-concentration impurity region that may be formed on a lateral surface facing the channel region. An etch stop layer 122 may be formed so as to cover an upper portion of the gate structure 110 and an upper portion of the metal silicide region 108 of the source/drain regions 107. The etch stop layer 122 may include, for example, a silicon nitride. According to at least one example embodiment, the etch stop layer 122 may include SiCN, $Si_3N_4$, SiON and/or SiBN. A thickness of the etch stop layer 122 may be about 200 Å to about 700 Å. The contact plugs 130 may be connected to the metal silicide region 108 through the interlayer insulating layer 120 and the etch stop layer 122.

Figure 11:
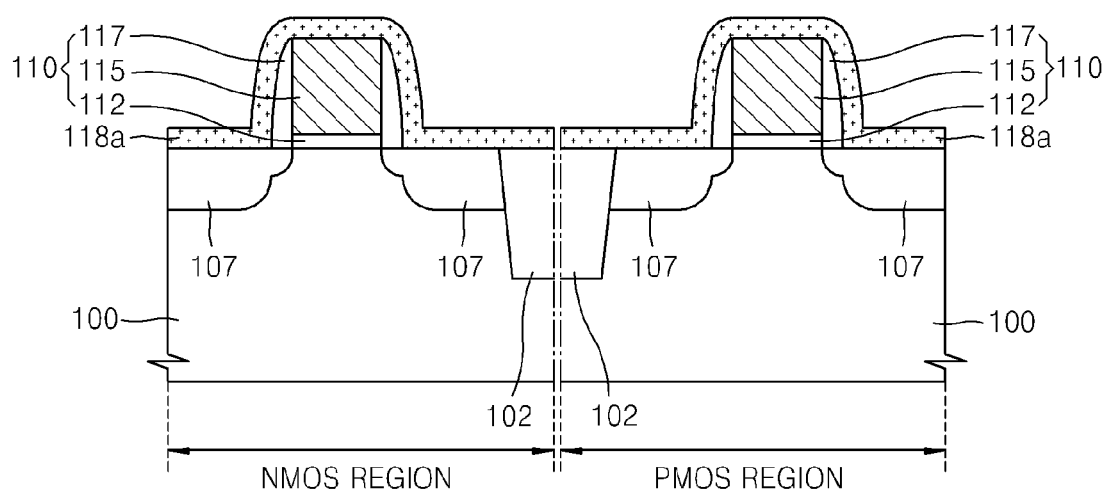
Figure 12:
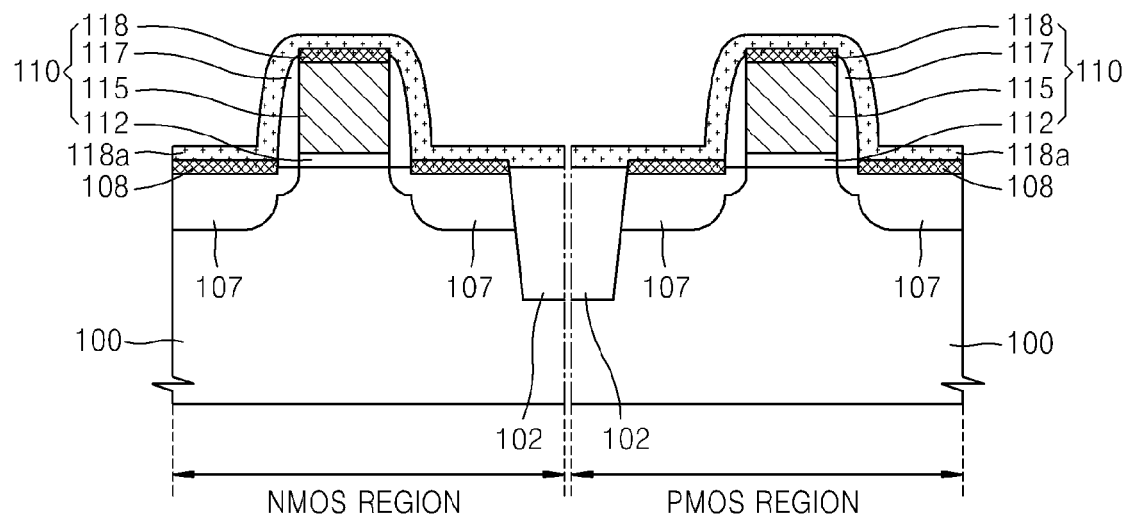
Figure 13:
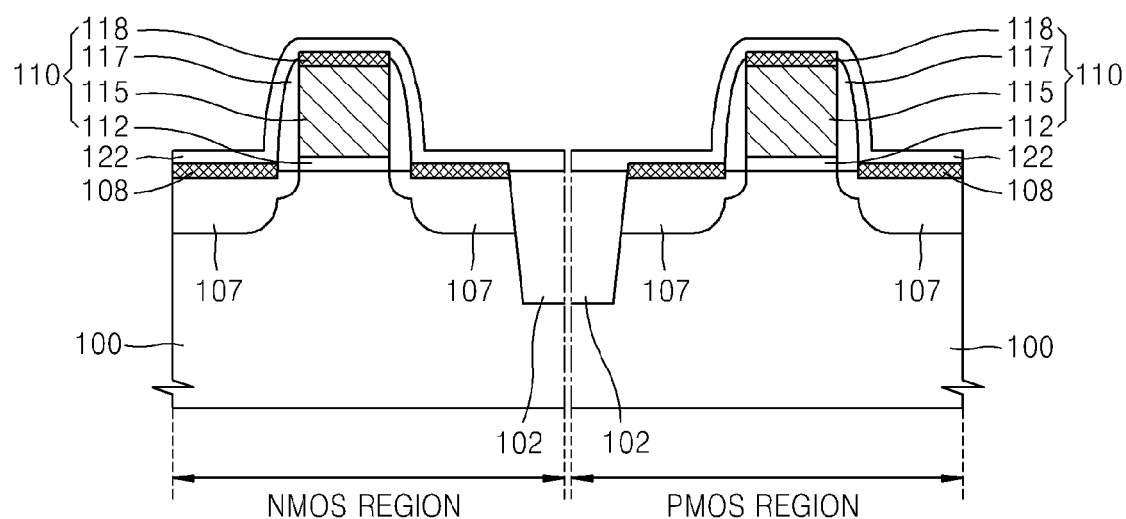

FIGS. 11-13 are cross-sectional diagrams illustrating methods of manufacturing semiconductor devices according to at least one other example embodiment. Referring to FIG. 11, the processes described with reference to FIGS. 2, 3, 5 and 6 may be performed. However, when impurities may be implanted in order to form the source/drain regions 107 as described with reference to FIG. 6, the impurities may be implanted at an angle. The source/drain regions 107 that may include a low-concentration impurity region and may be formed below the gate structure 110, may be formed towards the channel region, as shown in FIG. 11. A metal layer 118a may be formed on an entire surface of the gate structure 110 and the source/drain regions 107. The metal layer 118a may include, for example, one of titanium (Ti), cobalt (Co), platinum (Pt) and/or nickel (Ni). A thickness of the metal layer 118a may be, for example, in the range of about 100 Å to about 400 Å. According to at least one example embodiment, a capping layer (not shown) may be formed on the metal layer 118a. The capping layer may maintain the thermal stability of the gate structure 110 and may prevent the metal layer 118a from being oxidized during a silicidation reaction.

Referring to FIG. 12, a heat-treatment process may be performed to respectively form the metal silicide layer 118 and the metal silicide region 108 on the gate electrode 115 and the source/drain regions 107. A thickness of the metal silicide layer 118 and the metal silicide region 108 may each be about 100 Å to about 300 Å. The metal silicide layer 118 may correspond to a portion of the gate electrode 115. The metal silicide layer 118 and the metal silicide region 108 may each include, for example, a silicon compound including a metal (e.g., titanium (Ti), cobalt (Co), nickel (Ni), platinum (Pt) and/or tantalum (Ta)). According to at least one example embodiment, if the gate electrode 115 does not include polysilicon, the metal silicide layer 118 may not be formed on the gate electrode 115. The metal silicide layer 118 and the metal silicide region 108 formed without a photolithography process may each be referred to as self-aligned silicide (salicide) in that the metal silicide layer 118 and the metal silicide region 108 may each be formed at contact points between a metal and silicon. The metal silicide layer 118 and the metal silicide region 108 may reduce resistance of a gate electrode 115 and resistance of the source/drain regions 107, respectively.

Referring to FIG. 13, unreacted portions of the metal layer 118a, for example, the metal layer 118a on a surface of the spacer 117 and an upper portion of the device isolation layer 102, may be removed by, for example, an etch process. The etch stop layer 122 may be formed on an entire surface of the gate structure 110 and the metal silicide region 108. The etch stop layer 122 may be, for example, a silicon nitride layer. The etch stop layer 122 may be formed by, for example, chemical vapor deposition (CVD) (e.g., plasma enhanced CVD (PECVD), rapid thermal CVD (RTCVD), and/or low pressure CVD (LPCVD)). A thickness of the etch stop layer 122 may be about 200 Å to about 700 Å. The processes described with reference to FIGS. 7-9 may be performed to complete the manufacture of the semiconductor device 2000 of FIG. 10. When the contact holes H may be formed by partially etching the interlayer insulating layer 120 on the source/drain regions 107 in the process described with reference to FIG. 7, the etch stop layer 122 may be used as an etch stop layer. For example, when the etch stop layer 122 is formed of a silicon nitride, and the interlayer insulating layer 120 is formed of a silicon oxide, an etch selectivity of the etch stop layer 122 may be high with respect to the interlayer insulating layer 120.

Figure 14A:
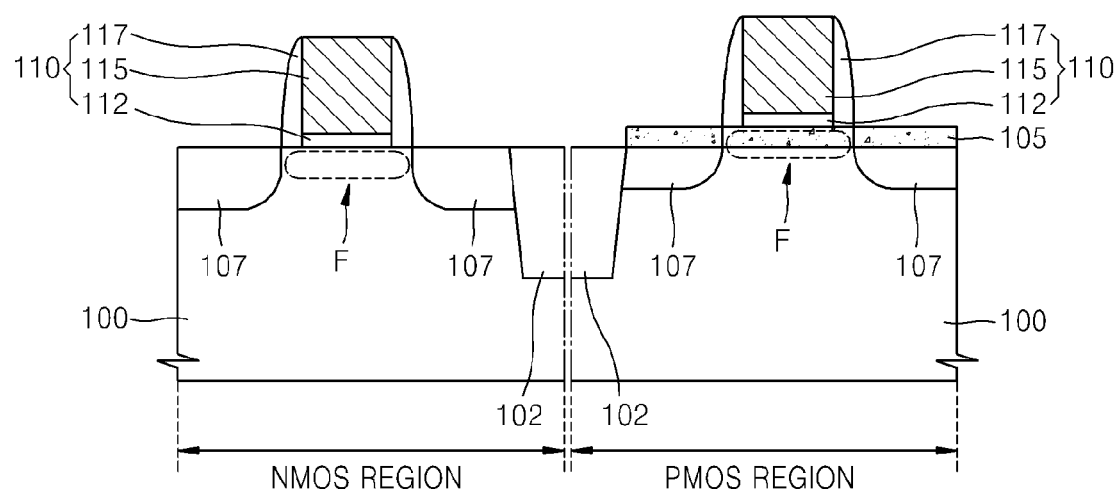
FIGS. 14A and 14B are cross-sectional diagrams illustrating the distribution of fluorine in a semiconductor device according to example embodiments.
Figure 14B:
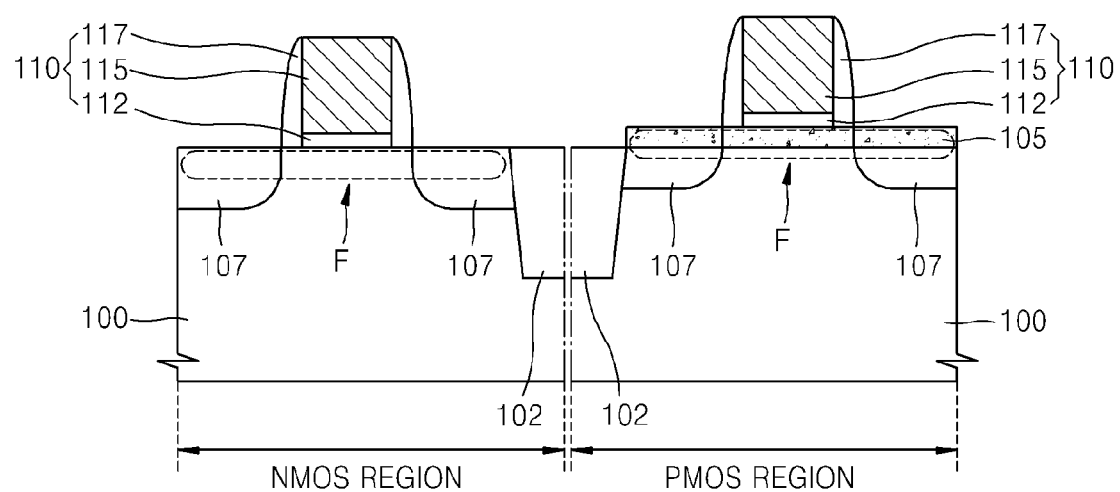

FIGS. 14A and 14B are cross-sectional diagrams illustrating the distribution of fluorine (F) in a semiconductor device according to example embodiments. FIG. 14A may illustrate a state of a semiconductor device after the source/drain regions 107 are formed as described with reference to FIG. 6. A region indicated by dotted lines between the source/drain regions 107 may be a fluorine implantation region F into which fluorine ions may be implanted. As shown in FIG. 14A, fluorine ions may be implanted into a channel region of the semiconductor device. According to at least one example embodiment, in order to form the fluorine implantation region F in the channel region only, the fluorine ion implantation process may be performed at an angle after the gate structure 110 is formed. According to at least one example embodiment, the fluorine implantation region F may be formed by patterning a separate mask layer to expose a portion where the channel is to be formed and then performing the fluorine ion implantation process.

FIG. 14B may illustrate another example embodiment including a fluorine implantation region F. A region indicated by dotted lines in the source/drain regions 107 and the channel region may be the fluorine implantation region F. When the fluorine ion implantation process is performed after the semiconductor layer 105 of the PMOS region is formed, the fluorine implantation region F may be formed. Although the fluorine ion implantation process may be performed prior to the forming of the semiconductor layer 105 of the PMOS region, fluorine may be dispersed near an interface between the channel region and the gate insulating layer 112 due to heat that may be generated during a subsequent process.

Figure 15:
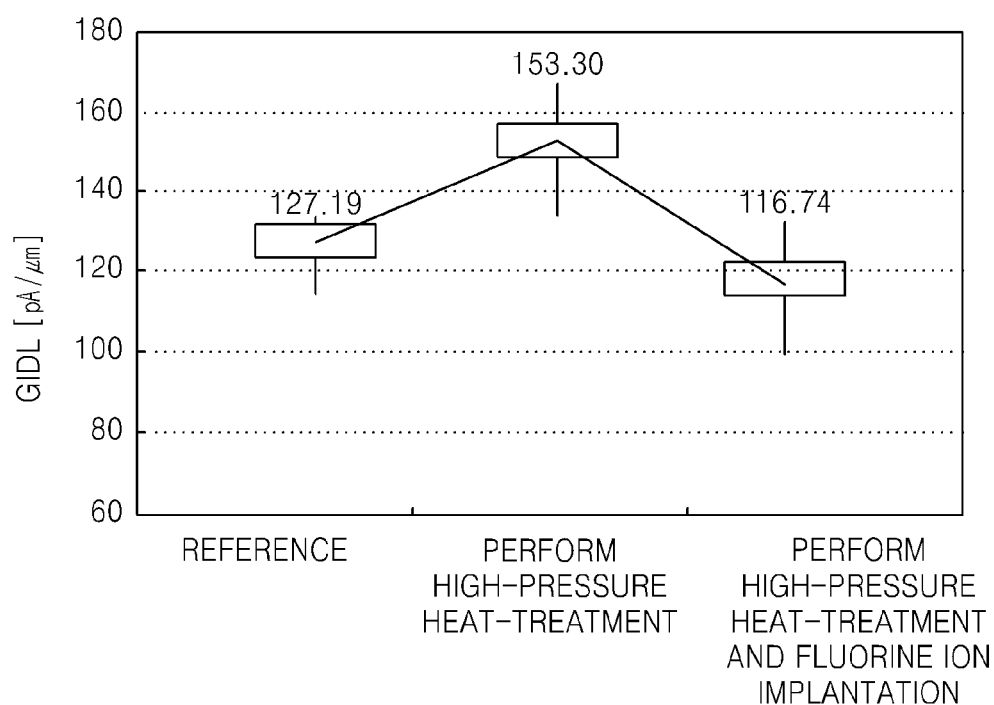

FIG. 15 is a graph illustrating semiconductor device characteristics according to at least one example embodiment. FIG. 15 may illustrate variance in gate-induced drain leakage (GIDL) of a PMOS transistor as the high-pressure heat-treatment process described with reference to FIG. 9 is performed on the PMOS transistor. The term 'reference' of FIG. 15 may indicate where the high-pressure heat-treatment and the fluorine ion implantation process are not performed. When the high-pressure heat-treatment process is performed alone, the GIDL may be increased compared to the 'reference.' According to at least one example embodiment, when the fluorine ion implantation process is performed and the high-pressure heat-treatment process is performed, the GIDL may be reduced. According to the at least one example embodiment, the GIDL may be reduced by about 10.4 pA/μm compared to in the case where the high-pressure heat-treatment and the fluorine ion implantation process are not performed. Such GIDL characteristics may be within a target range. As a result of measurement of GIDL characteristics, when the fluorine ion implantation process and the high-pressure heat-treatment process are performed, the GIDL characteristics may be improved.

Figure 16A:
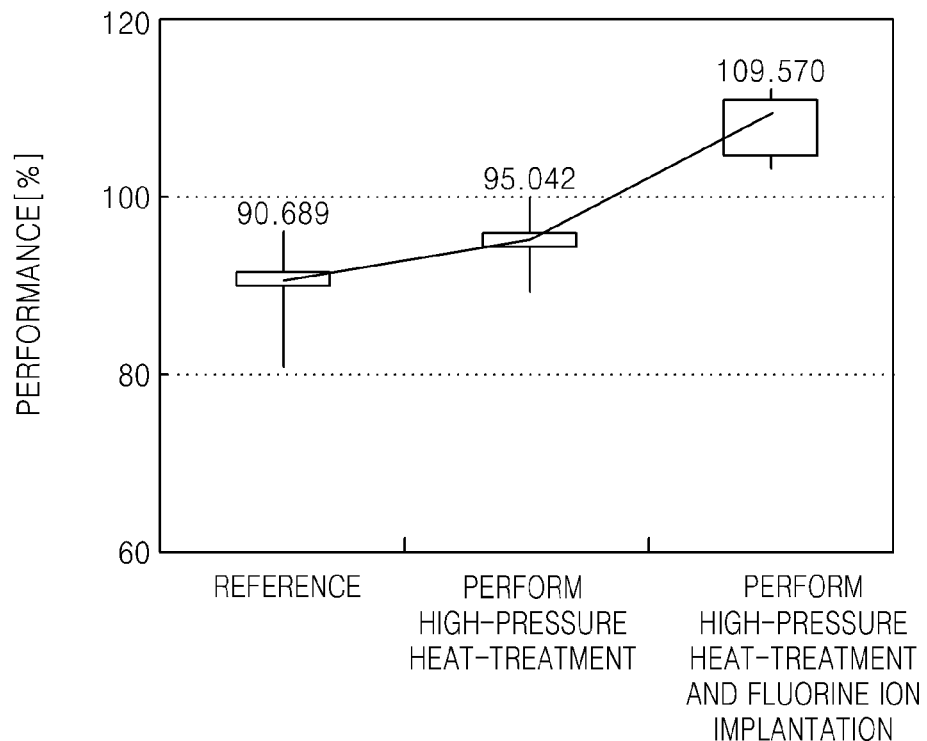
Figure 16B:
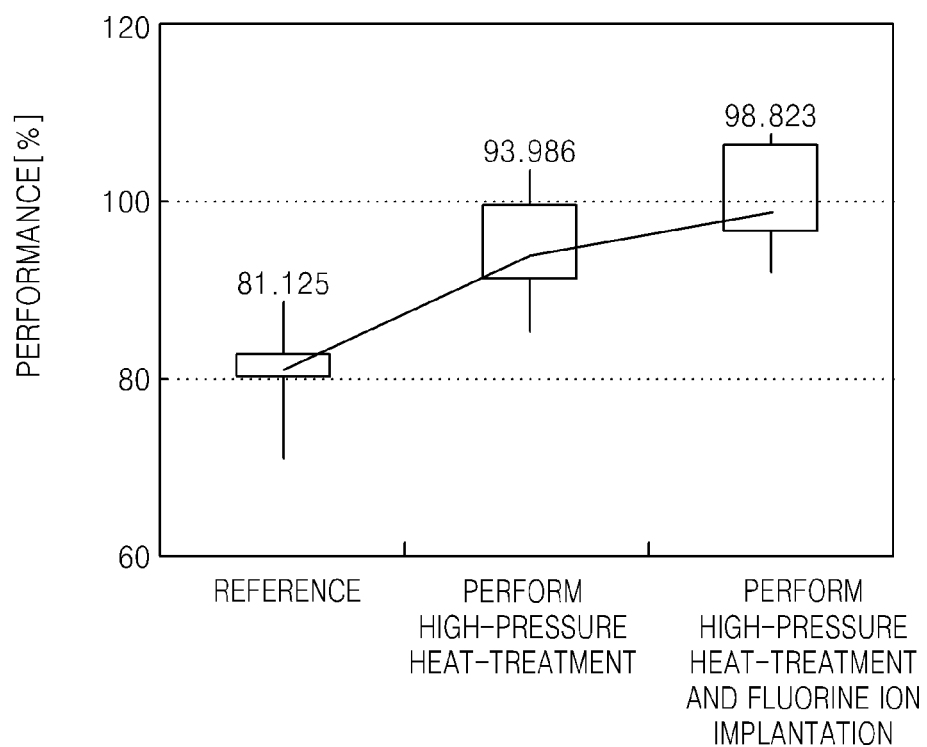

FIGS. 16A and 16B are graphs illustrating semiconductor device characteristics according to at least one example embodiment. FIGS. 16A and 16B may show performance characteristics measured for NMOS and PMOS transistors, according to processes to be performed thereon, respectively. The performance characteristics may correspond to values converted from an on-current and an off-current of transistors. The performance characteristics may correspond to a ratio of a measured on-current value to a target on-current value with respect to an off-current value. The term 'reference' of FIGS. 16A and 16B illustrates cases where the high-pressure heat-treatment process and the fluorine ion implantation process are not performed.

In FIG. 16A, the performance characteristics of the NMOS transistor is relatively improved by performing the high-pressure heat-treatment process, and is remarkably improved by further performing the fluorine ion implantation process. The performance characteristics of the NMOS transistor may be improved by about 18.9%, compared to in the case where the high-pressure heat-treatment process and the fluorine ion implantation process are not performed. In FIG. 16B, the performance characteristics of the PMOS transistor may be remarkably improved by performing the high-pressure heat-treatment process, and may be further improved by further performing the fluorine ion implantation process. The performance characteristics of the PMOS transistor may be improved by about 17.7%, compared to in the case where the high-pressure heat-treatment process and the fluorine ion implantation process are not performed.

According to example embodiments, when both a high-pressure heat-treatment process and a fluorine ion introduction process (e.g., an implant process) are performed, the performance characteristics of the NMOS and PMOS transistors may be improved.

While example embodiments have been particularly shown and described, it will be understood by one of ordinary skill in the art that variations in form and detail may be made therein without departing from the spirit and scope of the following claims.

What is claimed is:

1. A method of manufacturing a semiconductor device, the method comprising:
    implanting fluorine ions into an upper surface of the substrate, the substrate including an NMOS region and a PMOS region;
    forming a first gate electrode on the substrate in the NMOS region and a second gate electrode on the substrate in the PMOS region;
    forming source and drain regions adjacent to the first and second gate electrodes;
    performing a high-pressure heat-treatment process on the substrate using a non-oxidizing gas;
    forming contact plugs electrically connected to the source and drain regions; and
    forming a wiring line connected to the contact plugs,
    wherein the forming contact plugs and the forming a wiring line are performed prior to the performing of the high-pressure heat-treatment process.

2. The method of claim 1, wherein the performing a high-pressure heat-treatment process is performed both after the forming a first gate electrode and a second gate electrode, and after the forming a wiring line.

3. A method of manufacturing a semiconductor device, the method comprising:
    heat treating a substrate including a plurality of fluorinated transistor channel regions under high pressure in a non-oxidizing atmosphere;
    introducing fluorine into the plurality of transistor channel regions in the substrate,
        wherein at least one first channel region of the plurality of transistor channel regions in a first transistor includes at least one of a Group IV semiconductor other than silicon, a Group III-V compound semiconductor, and a Group II-VI oxide semiconductor, and
        at least one second channel region of the plurality of transistor channel regions in a second transistor is single crystal silicon;
    forming a semiconductor layer on the substrate, the at least one first channel region including at least a portion of the semiconductor layer;
    forming a plurality of gate stacks on the substrate,
        wherein the introducing fluorine includes injecting fluorine into the substrate at least one of prior to the forming a semiconductor layer, after the forming a semiconductor layer, and after the forming a plurality of gate stacks, and
        at least one of the plurality of gate stacks includes a high dielectric constant dielectric layer and a metal layer; and
    forming a final wiring layer of the semiconductor device prior to the heat treating a substrate.

4. The method of claim 3, wherein
    a band gap of the semiconductor layer is less than a band gap of the at least one second channel region, and
    a charge mobility of the semiconductor layer is greater than a charge mobility of the at least one second channel region.

* * * * *